US011989228B2

(12) United States Patent
Hirst et al.

(10) Patent No.: US 11,989,228 B2
(45) Date of Patent: May 21, 2024

(54) MULTI-STATE PROGRAMMING OF MEMORY CELLS

(71) Applicant: Micron Technology, Inc., Boise, ID (US)

(72) Inventors: Jeremy M. Hirst, Orangevale, CA (US); Shanky K. Jain, Folsom, CA (US); Hernan A. Castro, Shingle Springs, CA (US); Richard K Dodge, Santa Clara, CA (US); William A. Melton, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 255 days.

(21) Appl. No.: 17/526,121

(22) Filed: Nov. 15, 2021

(65) Prior Publication Data
US 2022/0075817 A1   Mar. 10, 2022

Related U.S. Application Data

(63) Continuation of application No. 16/729,787, filed on Dec. 30, 2019, now Pat. No. 11,177,009.

(51) Int. Cl.
*G06F 16/587* (2019.01)
*G06F 16/21* (2019.01)
(Continued)

(52) U.S. Cl.
CPC .......... *G06F 16/587* (2019.01); *G06F 16/219* (2019.01); *G11C 11/5614* (2013.01);
(Continued)

(58) Field of Classification Search
CPC . G06F 16/587; G06F 16/219; G11C 11/5614; G11C 13/0004; G11C 13/0069; G11C 2213/77
See application file for complete search history.

(56) References Cited

U.S. PATENT DOCUMENTS 8,031,516 B2   10/2011   Tang
9,117,519 B2    8/2015   Spessot et al.
(Continued)

OTHER PUBLICATIONS

International Search Report and Written Opinion from related International PCT Application No. PCT/US2020/064202, dated Apr. 1, 2021, 12 pages.
(Continued)

*Primary Examiner* — Jerome Leboeuf
(74) *Attorney, Agent, or Firm* — Brooks, Cameron & Huebsch, PLLC

(57) ABSTRACT

The present disclosure includes apparatuses, methods, and systems for multi-state programming of memory cells. An embodiment includes a memory having a plurality of memory cells, and circuitry configured to program a memory cell of the plurality of memory cells to one of a plurality of possible data states by applying a voltage pulse to the memory cell, determining the memory cell snaps back in response to the applied voltage pulse, turning off a current to the memory cell upon determining the memory cell snaps back, and applying a number of additional voltage pulses to the memory cell after turning off the current to the memory cell.

20 Claims, 9 Drawing Sheets

(51) Int. Cl.
*G11C 11/56* (2006.01)
*G11C 13/00* (2006.01)

(52) U.S. Cl.
CPC ...... *G11C 13/0004* (2013.01); *G11C 13/0069* (2013.01); *G11C 2213/77* (2013.01)

(56) References Cited

U.S. PATENT DOCUMENTS

| | | |
|---|---|---|
| 9,613,695 B2 | 4/2017 | Spessot et al. |
| 10,395,738 B2 | 5/2019 | Castro |
| 10,366,747 B2 | 7/2019 | Castro |
| 10,490,276 B2 | 11/2019 | Yasuhara |
| 2008/0117669 A1 | 5/2008 | Fuji et al. |
| 2015/0262661 A1 | 9/2015 | Chu et al. |
| 2016/0064078 A1 | 3/2016 | Fantini et al. |
| 2018/0019391 A1 | 1/2018 | Ohba et al. |
| 2018/0040370 A1* | 2/2018 | Tortorelli ........... G11C 13/0069 |
| 2018/0122472 A1* | 5/2018 | Pirovano ............ G11C 13/0097 |
| 2018/0151206 A1* | 5/2018 | Mantegazza ....... G11C 13/0004 |
| 2020/0118626 A1* | 4/2020 | Lee ........................ H10B 63/24 |
| 2022/0113892 A1* | 4/2022 | Fugazza ................ H10B 63/84 |

OTHER PUBLICATIONS

Office Action from related Taiwan Patent Application No. 109146404, dated Oct. 26, 2021, 22 pages.

* cited by examiner

MULTI-STATE PROGRAMMING OF MEMORY CELLS

PRIORITY INFORMATION

This application is a Continuation of U.S. application Ser. No. 16/729,787, filed on Dec. 30, 2019, the contents of which are incorporated herein by reference.

TECHNICAL FILED

The present disclosure relates generally to semiconductor memory and methods, and more particularly, to multi-state programming of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
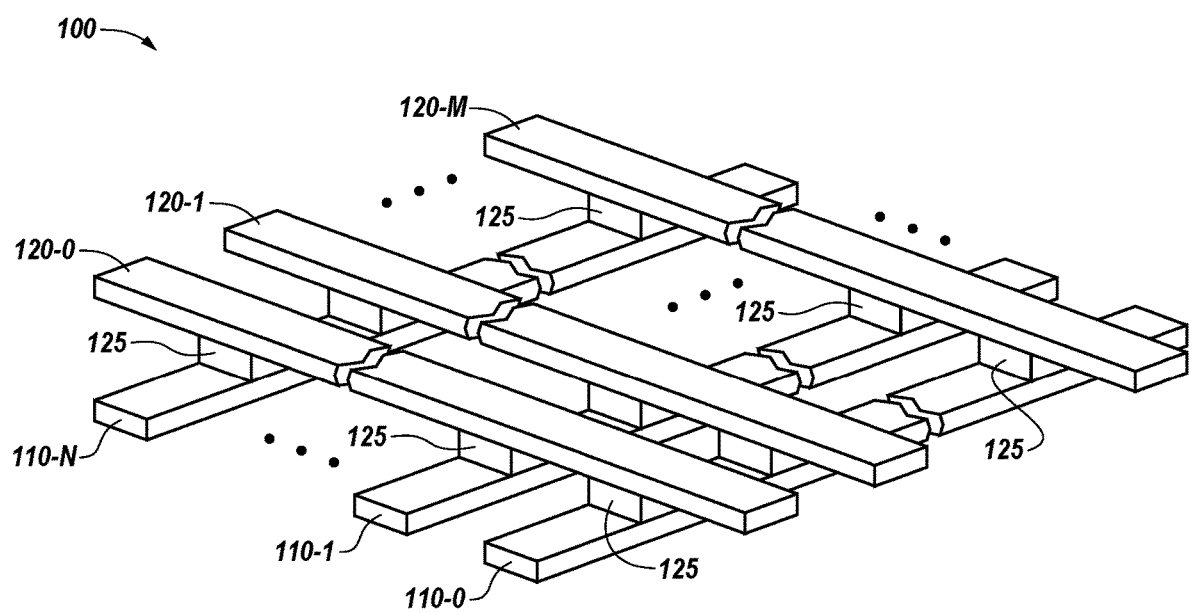
FIG. 1 is a three-dimensional view of an example of a memory array, in accordance with an embodiment of the present disclosure.

The present disclosure includes apparatuses, methods, and systems for multi-state programming of memory cells. An embodiment includes a memory having a plurality of memory cells, and circuitry configured to program a memory cell of the plurality of memory cells to one of a plurality of possible data states by applying a voltage pulse to the memory cell, determining the memory cell snaps back in response to the applied voltage pulse, turning off a current to the memory cell upon determining the memory cell snaps back, and applying a number of additional voltage pulses to the memory cell after turning off the current to the memory cell.

Embodiments of the present disclosure can provide benefits, such as increased density, reduced cost, increased performance, reduced power consumption, and/or faster and/or more complex operations, as compared to previous memory devices. For example, previous approaches for programming resistance variable memory cells, such as self-selecting memory cells, may be able to generate two different states for the cells, such that the cells can be programmed to one of two possible data states (e.g., state 0 or state 1). However, programming approaches for resistance variable memory cells in accordance with the present disclosure can generate additional (e.g., more than two) data states for the cells, such that the cells can be programmed to one of at least three possible data states.

Such multi-state programming can utilize multiple threshold voltages to support complex memory operations, such as, for instance, machine learning applications, in which data is encoded and matching functions or partial matching functions (e.g., Hamming distances) are computed. For instance, such multi-state programming can support the computation of the matching function or partial matching function of an input vector pattern with many stored vectors in an efficient manner.

Further, such multi-state programming can be useful for reducing the cost and/or increasing the density of standard memory applications. For example, such multi-state programming can reduce the number of bits needed to encode the equivalent number of data states utilizing previous two-state programming approaches. These extra bits could be used for error correction code (ECC) and/or data redundancy operations, for instance.

Further, such multi-state programming can be useful for increasing the performance of the memory. For example, such multi-state programming can be used to place memory cells (e.g., resistance variable memory cells) in a state that provides lower leakage in the memory array. Further, such multi-state programming can be used to place memory cells in a state that allows for higher inhibit voltages to be used on the array without making it difficult to select the cells of the array. This may be useful, for example, during initialization (e.g., first firing) of the array, when higher voltages may need to be applied to the array.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

Figure 2A:
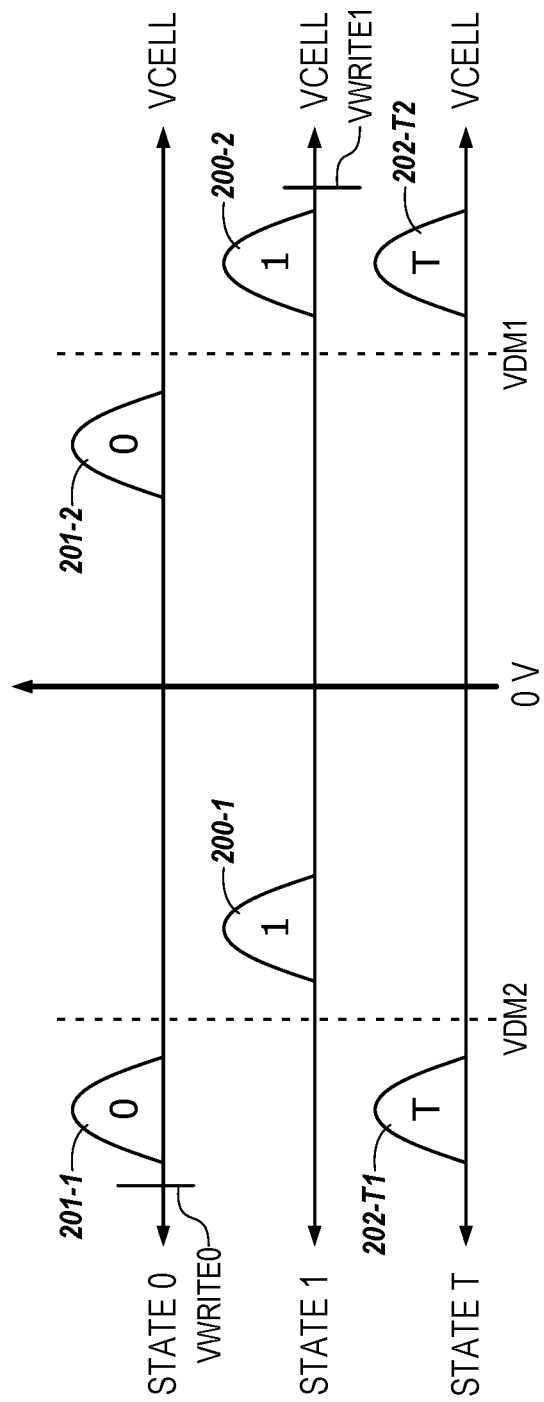
FIG. 2A illustrates threshold voltage distributions associated with memory states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of three possible data states (e.g., state 0, state 1, or state T). That is, FIG. 2A illustrates threshold voltage distributions associated with three possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 200-1, 200-2, 201-1, 201-2, 202-T1, and 202-T2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
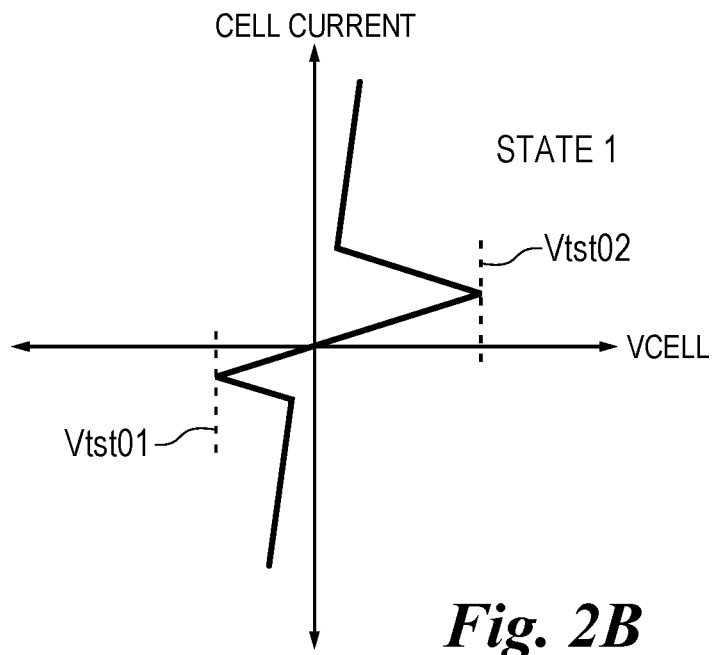
FIG. 2B is an example of a current-versus-voltage curve corresponding to a memory state of FIG. 2A, in accordance with an embodiment of the present disclosure.
Figure 2C:
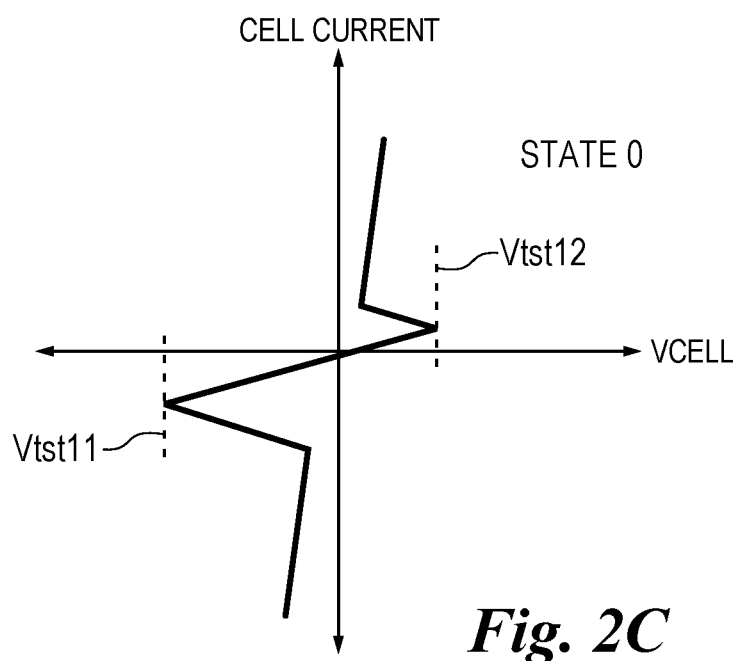
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 200-1 and 200-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

In some examples, the magnitudes of the threshold voltages of a memory cell 125 in a particular state may be symmetric for different polarities, as shown in FIG. 2A. For example, the threshold voltage of a memory cell 125 programmed to state T may have the same magnitude in opposite polarities. For instance, in the example illustrated in FIG. 2A, a third data state (e.g., state T) is associated with a symmetric threshold voltage distribution (e.g., threshold voltage distributions 202-T1 and 202-T2) whose magnitude is substantially equal (e.g. high) for both a positive polarity and a negative polarity. In such an example, an applied voltage magnitude sufficient to cause a memory cell 125 to snap back can be the same for different applied voltage polarities.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 200-2) or state T (e.g., threshold voltage distribution 202-T2). Similarly, VDM2 is a negative voltage used to distinguish cells in state 1 (e.g., threshold voltage distribution 200-1) from cells in state 0 (e.g., threshold voltage distribution 201-1) or state T (e.g., threshold voltage distribution 202-T1). In the examples of FIGS. 2A-2C, a memory cell 125 in a positive state 1 or T does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 or T does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 200-1 and 200-2 can be designated as state 0). Further, embodiments can include more than three possible data states to which a memory cell can be programmed, as will be further described herein (e.g., in connection with FIGS. 3A-3B).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 200-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

Figure 3A:
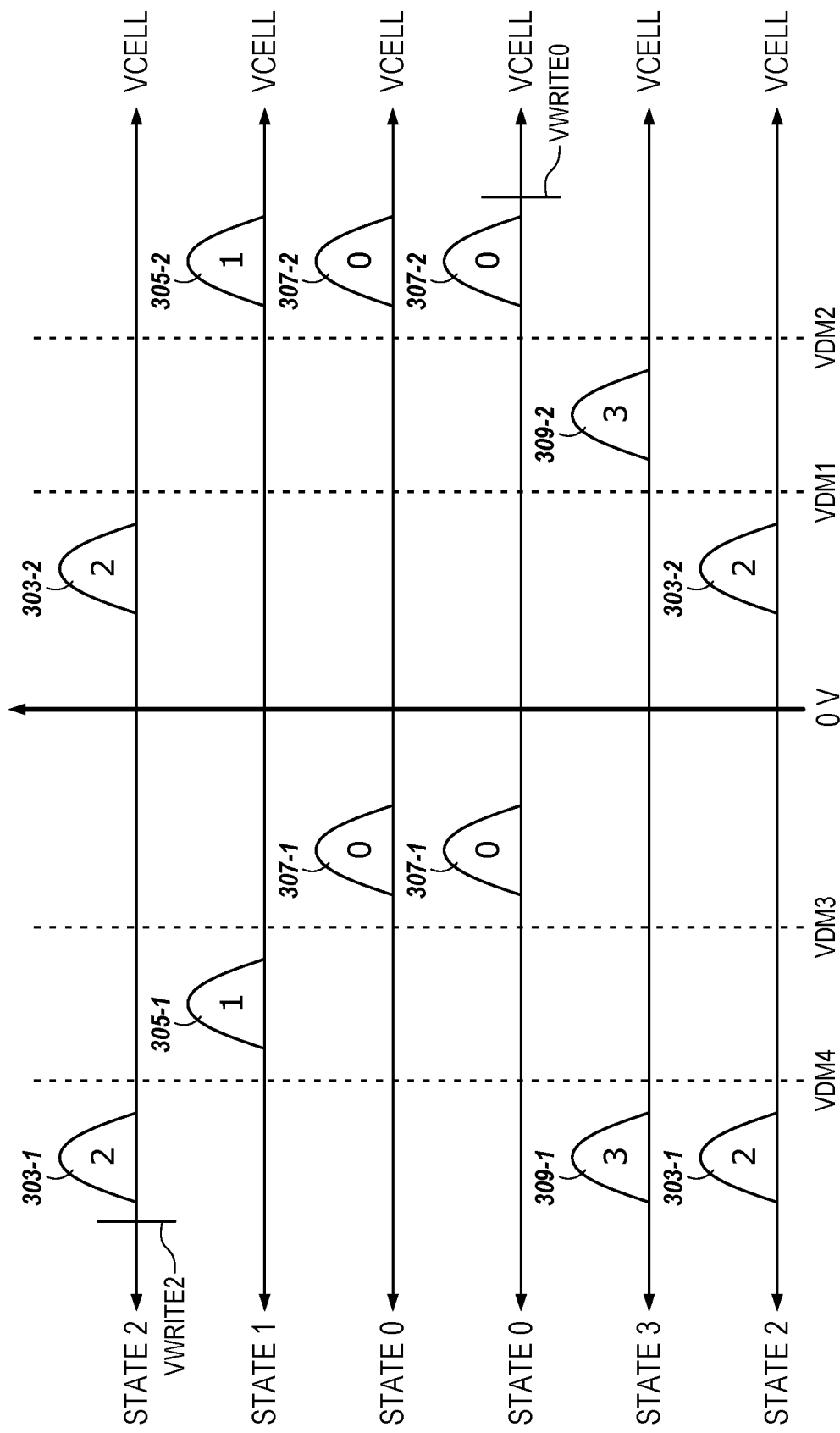
FIG. 3A illustrates threshold voltage distributions associated with memory states of memory cells, in accordance with an embodiment of the present disclosure.
Figure 3B:
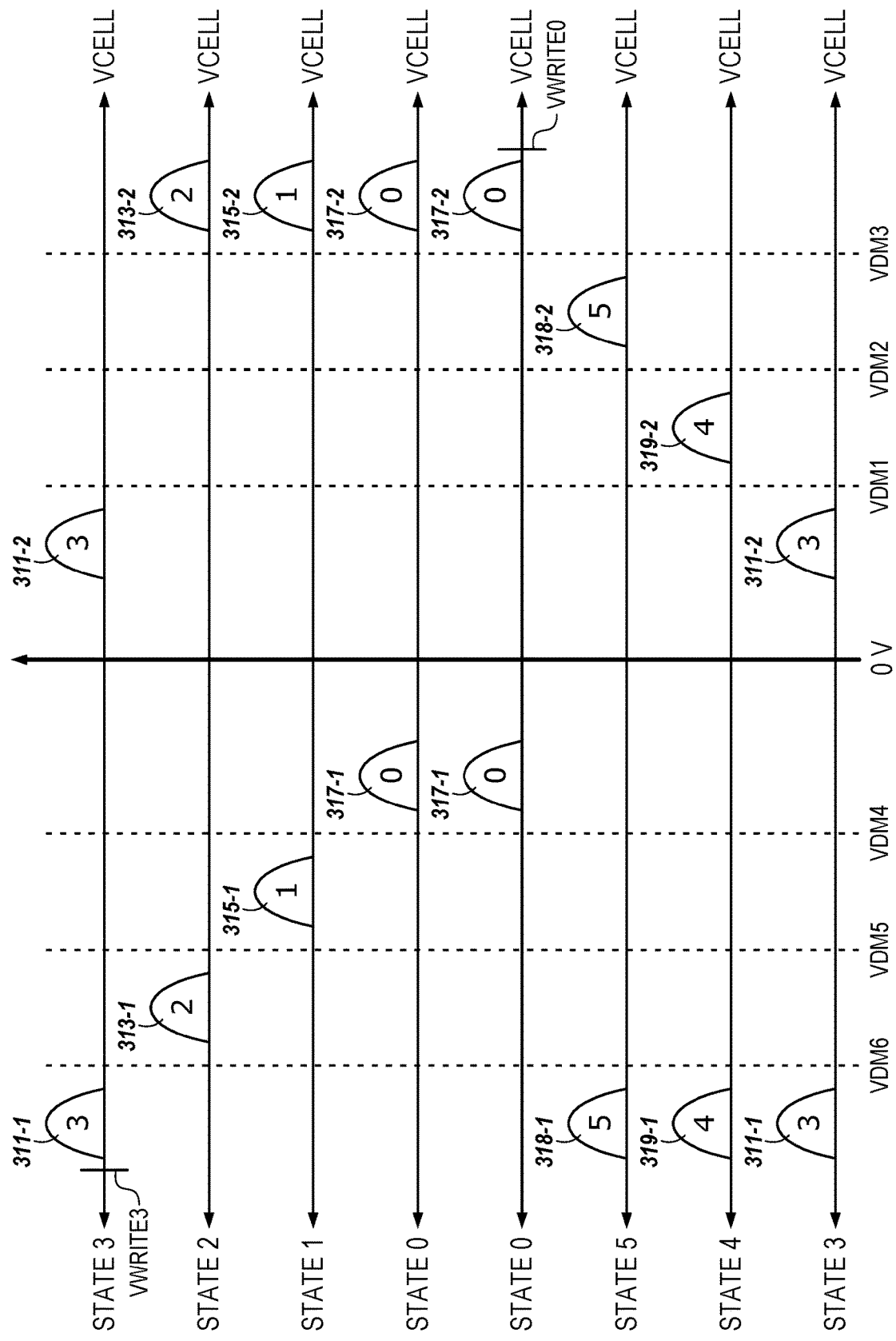
FIG. 3B illustrates threshold voltage distributions associated with memory states of memory cells, in accordance with an embodiment of the present disclosure.

FIGS. 3A and 3B each illustrate threshold distributions associated with various states of memory cells, such as memory cells 125 illustrated in FIG. 1, in accordance with an embodiment of the present disclosure. For instance, in the example shown in FIG. 3A, the memory cells can be programmed to one of four possible data states (e.g., state 0, state 1, state 2, or state 3). That is, FIG. 3A illustrates threshold voltage distributions associated with four possible data states to which the memory cells can be programmed. In the example shown in FIG. 3B, the memory cells can be programmed to one of six possible data states (e.g., state 0, state 1, state 2, state 3, state 4, or state 5). That is, FIG. 3B illustrates threshold voltage distributions associated with six possible data states to which the memory cells can be programmed.

In FIGS. 3A and 3B, the voltage VCELL may correspond to a voltage differential applied to (e.g., across) the memory cell (e.g., VCELL=VBL−VWL), as previously described in connection with FIG. 2A. The threshold voltage distributions (e.g., ranges) 303-1, 303-2, 305-1, 305-2, 307-1, 307-2, 309-1, 309-2, 311-1, 311-2, 313-1, 313-2, 315-1, 315-2, 317-1, 317-2, 318-1, 318-2, 319-1, and 319-2 may represent a statistical variation in the threshold voltages of memory cells programmed to a particular state.

In some examples, the magnitudes of the threshold voltages of a memory cell 125 in a particular state may be asymmetric for different polarities, as shown in FIGS. 3A and 3B. For instance, in the example illustrated in FIG. 3A, a first data state (e.g., state 2) is associated with a first asymmetric threshold voltage distribution (e.g., threshold voltage distributions 303-1 and 303-2) whose magnitude is greater for a negative polarity than a positive polarity, a second data state (e.g., state 1) is associated with a second asymmetric threshold voltage distribution (e.g., threshold voltage distributions 305-1 and 305-2) whose magnitude is greater for a positive polarity than a negative polarity, a third data state (e.g., state 0) is associated with a third asymmetric threshold voltage distribution (e.g., threshold voltage distributions 307-1 and 307-2) whose magnitude is greater for a positive polarity than a negative polarity, and a fourth data state (e.g., state 3) is associated with a fourth asymmetric threshold voltage distribution (e.g., threshold voltage distributions 309-1 and 309-2) whose magnitude is greater for a negative polarity than a positive polarity. Further, as shown in FIG. 3A, the magnitudes of threshold voltage distributions 303-1 and 309-1 may be substantially equal and greater than the magnitude of threshold voltage distribution 305-1, which in turn may be greater than the magnitude of threshold voltage distribution 307-1, and the magnitudes of threshold voltage distributions 305-2 and 307-2 may be substantially equal and greater than the magnitude of threshold voltage distribution 309-2, which in turn may be greater than the magnitude of threshold voltage distribution 303-2.

Further, in the example illustrated in FIG. 3B, a first data state (e.g., state 3) is associated with a first asymmetric threshold voltage distribution (e.g., threshold voltage distributions 311-1 and 311-2) whose magnitude is greater for a negative polarity than a positive polarity, a second data state (e.g., state 2) is associated with a second asymmetric threshold voltage distribution (e.g., threshold voltage distributions 313-1 and 313-2) whose magnitude is greater for a positive polarity than a negative polarity, a third data state (e.g., state 1) is associated with a third asymmetric threshold voltage distribution (e.g., threshold voltage distributions 315-1 and 315-2) whose magnitude is greater for a positive polarity than a negative polarity, a fourth data state (e.g., state 0) is associate with a fourth asymmetric voltage distribution (e.g., threshold voltage distributions 317-1 and 317-2) whose magnitude is greater for a positive polarity than a negative polarity, a fifth data state (e.g., state 5) is associated with a fifth asymmetric threshold voltage distribution (e.g., threshold voltage distributions 318-1 and 318-2) whose magnitude is greater for a negative polarity than a positive polarity, and a sixth data state (e.g., state 4) is associated with a sixth asymmetric threshold voltage distribution (e.g., threshold voltage distributions 319-1 and 319-2) whose magnitude is greater for a negative polarity than a positive polarity. Further, as shown in FIG. 3B, the magnitudes of threshold voltage distributions 311-1, 318-1, and 319-1 may be substantially equal and greater than the magnitude of threshold voltage distribution 313-1, which in turn may be greater than the magnitude of threshold voltage distribution 315-1, which in turn is greater than the magnitude of threshold voltage distribution 317-1, and the magnitudes of threshold voltage distributions 313-2, 315-2, and 317-2 may be substantially equal and greater than the magnitude of threshold voltage distribution 318-2, which in turn may be greater than the magnitude of threshold voltage distribution 319-2, which in turn may be greater than the magnitude of threshold voltage distribution 311-2.

FIG. 3A illustrates demarcation voltages VDM1, VDM2, VDM3, and VDM4, which can be used to determine the state of a memory cell programmed to one of the four data states illustrated in FIG. 3A (e.g., to distinguish between the states as part of a read operation). In this example, VDM1 and VDM2 are positive voltages with different magnitudes (e.g., the magnitude of VDM2 is greater than the magnitude of VDM1) that are used to distinguish cells in states 2 or 3 (e.g., in threshold voltage distributions 303-2 and 309-2) from cells in states 1 or 0 (e.g., threshold voltage distributions 305-2 or 307-2). Similarly, VDM3 and VDM4 are negative voltages with different magnitudes (e.g., the magnitude of VDM4 is greater than the magnitude of VDM3) that are used to distinguish cells in states 0 or 1 (e.g., threshold voltage distributions 307-1 or 305-1) from cells in states 2 or 3 (e.g., threshold voltage distributions 303-1 or 309-1).

In the example of FIG. 3A, a memory cell 125 in state 0 snaps back in response to applying VDM3, a memory cell 125 in state 1 snaps back in response to applying VDM4, a memory cell 125 in state 2 snaps back in response to applying VDM1, and a memory cell 125 in state 3 snaps back in response to applying VDM2. Accordingly, the state to which the memory cell 125 has been programmed can be determined (e.g., read) by sequentially applying the demarcation voltages to the cell (e.g., first applying VDM3 to the cell, then VDM4, then VDM1, then VDM2), until the cell snaps back in response to one of the applied demarcation voltages.

FIG. 3B illustrates demarcation voltages VDM1, VDM2, VDM3, VDM4, VDM5, and VDM6, which can be used to determine the state of a memory cell programmed to one of the six data states illustrated in FIG. 3B (e.g., to distinguish between the states as part of a read operation). In this example, VDM1, VDM2, and VDM3 are positive voltages with different magnitudes (e.g., the magnitude of VDM3 is greater than the magnitude of VDM2, which is greater than the magnitude of VDM1) that are used to distinguish cells in states 3, 4, or 5 (e.g., in threshold voltage distributions 311-2, 319-2, or 318-2) from cells in states 2, 1, or 0 (e.g., threshold voltage distributions 313-2, 315-2, or 317-2). Similarly, VDM4, VDM5, and VDM6 are negative voltages with different magnitudes (e.g., the magnitude of VDM6 is greater than the magnitude of VDM5, which is greater than the magnitude of VDM4) that are used to distinguish cells in states 0, 1, or 2 (e.g., threshold voltage distributions 317-1, 315-1, or 313-1) from cells in states 3, 4, or 5 (e.g., threshold voltage distributions 311-1, 319-1, or 318-1).

In the example of FIG. 3B, a memory cell 125 in state 0 snaps back in response to applying VDM4, a memory cell 125 in state 1 snaps back in response to applying VDM5, a memory cell 125 in state 2 snaps back in response to applying VDM6, a memory cell 125 in state 3 snaps back in response to applying VDM1, a memory cell 125 in state 4 snaps back in response to applying VDM2, and a memory cell in state 5 snaps back in response to applying VDM3. Accordingly, the state to which the memory cell 125 has been programmed can be determined (e.g., read) by sequentially applying the demarcation voltages to the cell (e.g., first applying VDM4 to the cell, then VDM5, then VDM6, then VDM1, then VDM2, then VDM3), until the cell snaps back in response to one of the applied demarcation voltages.

Embodiments are not limited to the examples shown in FIGS. 3A and 3B. For example, the numerical designations of the different states can be interchanged.

In an embodiment of the present disclosure, a memory cell, such as memory cells 125 illustrated in FIG. 1, can be programmed to one of a plurality of possible data states. For example, the memory cell can be programmed to one of the three possible data states described in connection with FIG. 2A, one of the four possible data states described in connection with FIG. 3A, or one of the six possible data states described in connection with FIG. 3B. The cell can be programed to the one of the plurality of possible data states by, for instance, changing (e.g., adjusting) the threshold voltage of the cell to one of a plurality of possible values, as will be further described herein.

For example, a voltage pulse can be applied to the memory cell. The voltage pulse can be, for instance, a bias voltage pulse (e.g., VCELL) with a magnitude high enough to cause (e.g., to be capable of causing) the memory cell to snap back. The bias voltage pulse can comprise, for instance, a voltage pulse having a first polarity and/or a voltage pulse having a second polarity that is opposite the first polarity, as previously described herein. For instance, applying the bias voltage pulse can comprise applying a positive 5.5 Volt (V)

pulse and/or a negative 5.5 V pulse to the memory cell. Further, the bias voltage pulse can comprise a voltage applied to a word line coupled to the cell (e.g., VWL) and a voltage applied to a bit line coupled to the cell (e.g., VBL), as previously described herein. An example illustrating such a voltage pulse (e.g., VWL and VBL) will be further described herein (e.g., in connection with FIG. 6).

Once (e.g., if) the memory cell snaps back to the conductive state in response to the applied bias voltage pulse, a pulse of current (e.g., a current transient) may flow through the memory cell. After a particular amount of time, the current transient through the cell may dissipate, and a DC current may be established across the cell. An example illustrating such a current flow through the memory cell will be further described herein (e.g., in connection with FIG. 6).

After the voltage pulse (e.g., the bias voltage pulse) has been applied to the memory cell, it can be determined (e.g., sensed and/or detected) that the memory cell has snapped back in response to the applied voltage pulse (e.g., in response to the positive or negative pulse). This determination can be made by, for example, sensing a voltage change associated with the memory cell (e.g., on a signal line coupled to the cell) that has occurred in response to the applied voltage pulse. For instance, sensing such a voltage change may comprise sensing that the voltage on the signal line (e.g., the word line) coupled to the cell meets or exceeds a particular voltage threshold (e.g., 0.45 V). An example further illustrating such a determination, and the circuitry that can be used to perform such a determination, will be further described herein (e.g., in connection with FIGS. 4 and 6).

Upon determining the memory cell has snapped back, the current to the memory cell (e.g., the current flows through the signal line coupled to the memory cell) can be turned off (e.g., inhibited). The current to the memory cell can be turned off, for instance, by turning off (e.g., disabling) a driver coupled to the memory cell (e.g., a word line driver and/or a bit line driver coupled to the word line and/or bit line, respectively, coupled to the cell), as will be further described herein (e.g., in connection with FIG. 5).

The current to the memory cell can be turned off quickly enough such that the snap back of the cell comprises a lower than nominal snapback energizing event (e.g., lower than if the current transient through the memory cell were allowed to fully dissipate to establish a DC current across the cell). For example, the current can be turned off immediately (e.g., with no delay) upon determining the memory cell has snapped back, or can be turned off after a particular amount of time (e.g., a short delay) has passed upon determining the memory cell has snapped back. This delay, and the circuitry that can be used to provide such a delay, will be further described herein (e.g., in connection with FIGS. 5 and 6).

After the current to the memory cell has been turned off, a number of short additional voltage pulses can be sequentially applied to the memory cell. As used herein, a short pulse can refer to a pulse having a duration that is shorter than the duration of the bias voltage. For example, the duration of each respective one of the additional voltage pulses can be 5 nanoseconds (ns). The magnitude of each respective one of the additional voltage pulses can be the same as the magnitude of the bias voltage. As an additional example, the magnitudes of the additional voltage pulses can be different (e.g., varied), which can change the impact of each respective additional pulse on the memory cell (e.g., on the threshold voltage of the cell). Further, the additional voltage pulses can each comprise a voltage applied to a word line coupled to the cell (e.g., VWL) and a voltage applied to a bit line coupled to the cell (e.g., VBL). An example illustrating such additional voltage pulses (e.g., VWL and VBL) will be further described herein (e.g., in connection with FIG. 6).

Applying the number of additional voltage pulses to the memory cell can incrementally change (e.g., adjust) the threshold voltage of the memory cell. For instance, applying a first short additional voltage pulse can change the threshold voltage of the cell to a first value that is within a first threshold voltage distribution, applying a second short additional voltage pulse can change the threshold voltage of the cell to a second value that is within a second threshold voltage distribution, etc. In such a manner, the memory cell can be programmed to one of a plurality of possible data states. An example illustrating the current flow through the memory cell as the additional voltage pulses are applied to the cell will be further described herein (e.g., in connection with FIG. 6).

As an example, with reference to FIG. 2A, to program the memory cell to state T illustrated in FIG. 2A, a single short additional voltage pulse having a first polarity or a second polarity that is opposite the first polarity can be applied to the memory cell. For example, applying a single short voltage pulse having a negative polarity to a memory cell in state 0 illustrated in FIG. 2A can program the cell to state T (e.g., change the state of the cell from 0 to T). For instance, the single short negative polarity voltage pulse may not change a threshold voltage of the cell observed (e.g., measured) as a high magnitude threshold in the negative direction, but may increase a threshold voltage of the cell observed as a low magnitude threshold in the positive direction to a high magnitude threshold (e.g., from threshold voltage distribution 201-2 to threshold voltage distribution 202-T2). As an additional example, applying a single short voltage pulse having a positive polarity to a memory cell in state 1 illustrated in FIG. 2A can program the cell to state T (e.g., change the state of the cell from 1 to T). For instance, the single short positive polarity voltage pulse may not change a threshold voltage of the cell observed (e.g., measured) as a high magnitude threshold in the positive direction, but may increase a threshold voltage of the cell observed as a low magnitude threshold in the negative direction to a high magnitude threshold (e.g., from threshold voltage distribution 200-1 to threshold voltage distribution 202-T1).

As an additional example, with reference to FIG. 3A, one short additional voltage pulse having a first polarity or a second polarity that is opposite the first polarity can be applied to the memory cell. For example, applying one short voltage pulse having a negative polarity to a memory cell in state 2 illustrated in FIG. 3A can program the cell to state 1 (e.g., change the state of the cell from 2 to 1). For instance, the one short negative polarity voltage pulse may decrease a threshold voltage of the cell observed (e.g., measured) as a highest magnitude threshold in the negative direction to a lower magnitude threshold (e.g., from threshold voltage distribution 303-1 to threshold voltage distribution 305-1), and may increase a threshold voltage of the cell observed as a lowest magnitude threshold in the positive direction to a highest magnitude threshold (e.g., from threshold voltage distribution 303-2 to threshold voltage distribution 305-2). As an additional example, applying one short voltage pulse having a positive polarity to a memory cell in state 0 illustrated in FIG. 3A can program the cell to state 3 (e.g., change the state of the cell from 0 to 3). For instance, the one short positive polarity voltage pulse may increase a threshold voltage of the cell observed (e.g., measured) as a lowest magnitude threshold in the negative direction to a highest magnitude threshold (e.g., from threshold voltage distribution 307-1 to threshold voltage distribution 309-1), and may decrease a threshold voltage of the cell observed as a highest magnitude threshold in the positive direction to a lower magnitude threshold (e.g., from threshold voltage distribution 307-2 to threshold voltage distribution 309-2).

As an additional example, with reference to FIG. 3A, two short additional voltage pulses each having a first polarity or a second polarity that is opposite the first polarity can be applied to the memory cell. For example, applying two short voltage pulses each having a negative polarity to a memory cell in state 2 illustrated in FIG. 3A can program the cell to state 0 (e.g., change the state of the cell from 2 to 0). For instance, the first one of the two short negative polarity voltage pulses may decrease a threshold voltage of the cell observed (e.g., measured) as a highest magnitude threshold in the negative direction to a lower magnitude threshold (e.g., from threshold voltage distribution 303-1 to threshold voltage distribution 305-1) and may increase a threshold voltage of the cell observed as a lowest magnitude threshold in the positive direction to a highest magnitude threshold (e.g., from threshold voltage distribution 303-2 to threshold voltage distribution 307-2), and the second one of the two short negative polarity voltage pulses may further decrease the threshold voltage of the cell observed in the negative direction to a lowest magnitude threshold (e.g., from threshold voltage distribution 305-1 to threshold voltage distribution 307-1) but may not change the threshold voltage of the cell observed as the highest magnitude threshold in the positive direction.

As an additional example, applying two short voltage pulses each having a positive polarity to a memory cell in state 0 illustrated in FIG. 3A can program the cell to state 2 (e.g., change the state of the cell from 0 to 2). For instance, the first one of the two short positive polarity voltage pulses may increase a threshold voltage of the cell observed (e.g., measured) as a lowest magnitude threshold in the negative direction to a highest magnitude threshold (e.g., from threshold voltage distribution 307-1 to threshold voltage distribution 303-1) and may decrease a threshold voltage of the cell observed as a highest magnitude threshold in the positive direction to a lower magnitude threshold (e.g., from threshold voltage distribution 307-2 to threshold voltage distribution 309-2), and the second one of the two short positive polarity voltage pulses may further decrease the threshold voltage of the cell observed in the positive direction to a lowest magnitude threshold (e.g., from threshold voltage distribution 309-2 to threshold voltage distribution 303-2) but may not change the threshold voltage of the cell observed as the highest magnitude threshold in the negative direction.

As an additional example, with reference to FIG. 3B, two short additional voltage pulses each having a first polarity or a second polarity that is opposite the first polarity can be applied to the memory cell. For example, applying two short voltage pulses each having a negative polarity to a memory cell in state 3 illustrated in FIG. 3B can program the cell to state 2 (e.g., change the state of the cell from 3 to 2). For instance, the two short negative polarity voltage pulses may decrease a threshold voltage of the cell observed (e.g., measured) as a highest magnitude threshold in the negative direction to a lower magnitude threshold (e.g., from threshold voltage distribution 311-1 to threshold voltage distribution 313-1), and may increase a threshold voltage of the cell observed as a lowest magnitude threshold in the positive direction to a highest magnitude threshold (e.g., from threshold voltage distribution 311-2 to threshold voltage distribution 313-2). As an additional example, applying two short voltage pulses each having a positive polarity to a memory cell in state 0 illustrated in FIG. 3B can program the cell to state 5 (e.g., change the state of the cell from 0 to 5). For instance, the two short positive polarity voltage pulses may increase a threshold voltage of the cell observed (e.g., measured) as a lowest magnitude threshold in the negative direction to a highest magnitude threshold (e.g., from threshold voltage distribution 317-1 to threshold voltage distribution 318-1), and may decrease a threshold voltage of the cell observed as a highest magnitude threshold in the positive direction to a lower magnitude threshold (e.g., from threshold voltage distribution 317-2 to threshold voltage distribution 318-2).

As an additional example, with reference to FIG. 3B, four short additional voltage pulses each having a first polarity or a second polarity that is opposite the first polarity can be applied to the memory cell. For example, applying four short voltage pulses each having a negative polarity to a memory cell in state 3 illustrated in FIG. 3B can program the cell to state 1 (e.g., change the state of the cell from 3 to 1). For instance, the first and second of the four short negative polarity voltage pulses may decrease a threshold voltage of the cell observed (e.g., measured) as a highest magnitude threshold in the negative direction to a lower magnitude threshold (e.g., from threshold voltage distribution 311-1 to threshold voltage distribution 313-1) and may increase a threshold voltage of the cell observed as a lowest magnitude threshold in the positive direction to a highest magnitude threshold (e.g., from threshold voltage distribution 311-2 to threshold voltage distribution 315-2), and the third and fourth of the four short negative polarity voltage pulses may further decrease the threshold voltage of the cell observed in the negative direction to a lower magnitude threshold (e.g., from threshold voltage distribution 313-1 to threshold voltage distribution 315-1) but may not change the threshold voltage of the cell observed as the highest magnitude threshold in the positive direction.

As an additional example, applying four short voltage pulses each having a positive polarity to a memory cell in state 0 illustrated in FIG. 3B can program the cell to state 4 (e.g., change the state of the cell from 0 to 4). For instance, the first and second of the four short positive polarity voltage pulses may increase a threshold voltage of the cell observed (e.g., measured) as a lowest magnitude threshold in the negative direction to a highest magnitude threshold (e.g., from threshold voltage distribution 317-1 to threshold voltage distribution 319-1) and may decrease a threshold voltage of the cell observed as a highest magnitude threshold in the positive direction to a lower magnitude threshold (e.g., from threshold voltage distribution 317-2 to threshold voltage distribution 318-2), and the third and fourth of the four short positive polarity voltage pulses may further decrease the threshold voltage of the cell observed in the positive direction to a lower magnitude threshold (e.g., from threshold voltage distribution 318-2 to threshold voltage distribution 319-2) but may not change the threshold voltage of the cell observed as the highest magnitude threshold in the negative direction.

As an additional example, with reference to FIG. 3B, six short additional voltage pulses each having a first polarity or a second polarity that is opposite the first polarity can be applied to the memory cell. For example, applying six short voltage pulses each having a negative polarity to a memory cell in state 3 illustrated in FIG. 3B can program the cell to state 0 (e.g., change the state of the cell from 3 to 0). For instance, the first and second of the six short negative polarity voltage pulses may decrease a threshold voltage of the cell observed (e.g., measured) as a highest magnitude threshold in the negative direction to a lower magnitude threshold (e.g., from threshold voltage distribution 311-1 to threshold voltage distribution 313-1) and may increase a threshold voltage of the cell observed as a lowest magnitude threshold in the positive direction to a highest magnitude threshold (e.g., from threshold voltage distribution 311-2 to threshold voltage distribution 317-2), the third and fourth of the six short negative polarity voltage pulses may further decrease the threshold voltage of the cell observed in the negative direction to a lower magnitude threshold (e.g., from threshold voltage distribution 313-1 to threshold voltage distribution 315-1) but may not change the threshold voltage of the cell observed as the highest magnitude threshold in the positive direction, and the fifth and sixth of the six short negative polarity voltage pulses may further decrease the threshold voltage of the cell observed in the negative direction to the lowest magnitude threshold (e.g., from threshold voltage distribution 315-1 to threshold voltage distribution 317-1) but may not change the threshold voltage of the cell observed as the highest magnitude threshold in the positive direction.

As an additional example, applying six short voltage pulses each having a positive polarity to a memory cell in state 0 illustrated in FIG. 3B can program the cell to state 3 (e.g., change the state of the cell from 0 to 3). For instance, the first and second of the six short positive polarity voltage pulses may increase a threshold voltage of the cell observed (e.g., measured) as a lowest magnitude threshold in the negative direction to a highest magnitude threshold (e.g., from threshold voltage distribution 317-1 to threshold voltage distribution 311-1) and may decrease a threshold voltage of the cell observed as a highest magnitude threshold in the positive direction to a lower magnitude threshold (e.g., from threshold voltage distribution 317-2 to threshold voltage distribution 318-2), the third and fourth of the six short positive polarity voltage pulses may further decrease the threshold voltage of the cell observed in the positive direction to a lower magnitude threshold (e.g., from threshold voltage distribution 318-2 to threshold voltage distribution 319-2) but may not change the threshold voltage of the cell observed as the highest magnitude threshold in the negative direction, and the fifth and sixth of the six short positive polarity voltage pulses may further decrease the threshold voltage of the cell observed in the positive direction to the lowest magnitude threshold (e.g., from threshold voltage distribution 319-2 to threshold voltage distribution 311-2) but may not change the threshold voltage of the cell observed as the highest magnitude threshold in the negative direction.

Figure 4:
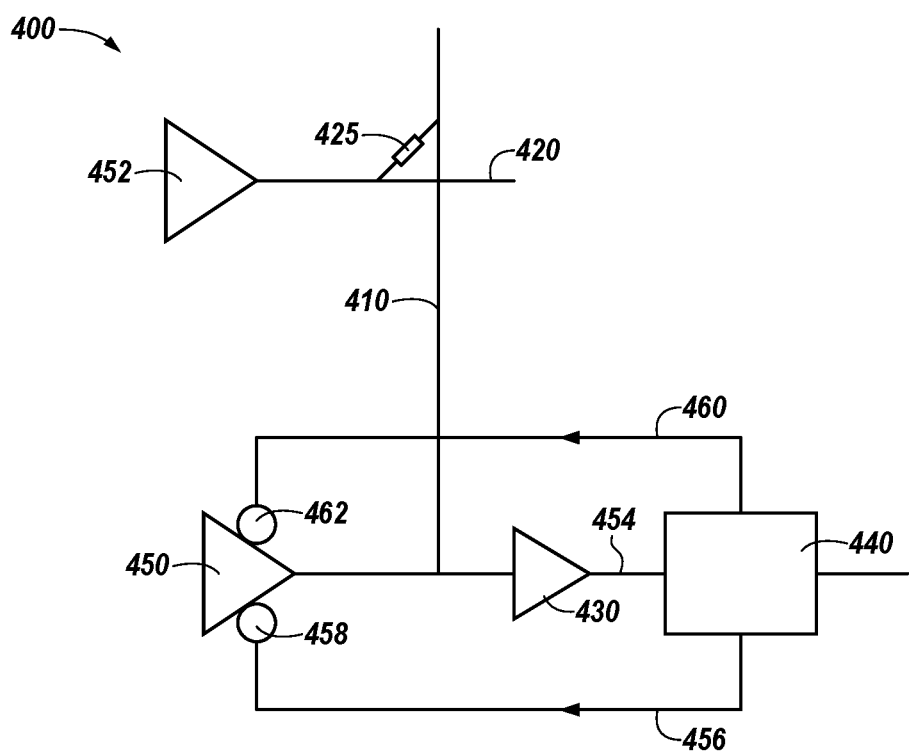
FIG. 4 illustrates an example of a portion of a memory array and associated circuitry, in accordance with an embodiment of the present disclosure.

FIG. 4 illustrates an example of a portion of a memory array 400 and associated circuitry for detecting snapback events in accordance with an embodiment of the present disclosure. Memory array 400 may be a portion of memory array 100 previously described in connection with FIG. 1. Memory cell 425 is coupled to a word line 410 and a bit line 420 and may be operated as described herein.

The example shown in FIG. 4 includes a driver 450 (e.g., a word line driver 450) coupled to word line 410. Word line driver 450 may supply bi-polar (e.g., positive and negative) current and/or voltage signals to word line 410. A sense amplifier 430, which may comprise a cross-coupled latch, is coupled to word line driver 450, and may detect positive and negative currents and/or positive and negative voltages on word line 410. In some examples, sense amplifier 430 may be part of (e.g., included in) word line driver 450. For example, the word line driver 450 may include the sensing functionality of sense amplifier 430. A bit line driver 452 is coupled to bit line 420 to supply positive and/or negative current and/or voltage signals to bit line 420.

The sense amplifier 430 and word line driver 450 are coupled to a latch 440, which can be used to store a data value indicating whether or not a snapback event of cell 425 has occurred responsive to an applied voltage differential. For instance, an output signal 454 of sense amplifier 430 is coupled to latch 440 such that responsive to detection, via sense amplifier 430, of memory cell 425 snapping back, the output signal 454 causes the appropriate data value to be latched in latch 440 (e.g., a data value of "1" or "0" depending on which data value is used to indicate a detected snapback event). As an example, if a latched data value of "1" is used to indicate a detected snapback event, then signal 454 will cause latch 440 to latch a data value of logical 1 responsive to a detected snapback of cell 425, and vice versa. The output signal 454 of sense amplifier 430 can also be coupled to delay circuitry, as will be further described herein (e.g., in connection with FIG. 5).

When a positive voltage differential VDM1 is applied to memory cell 425 (e.g., the word line voltage VWL1 is low and the bit line voltage VBL1 is high) and memory cell 425 stores state 0, voltage differential VDM1 may be greater than the threshold voltage Vtst12 (FIG. 2C), and memory cell 425 may snap back to a conductive state, causing the positive current flow, shown in FIG. 2C, through memory cell 425 from bit line 420 to word line 410. Sense amplifier 430 may detect this current, and/or a voltage associated therewith, for example, and may output signal 454 to latch 440 in response to detecting this current and/or voltage. For example, signal 454 may indicate to latch 440 (e.g., by having a logical high value) that current is positive, and thus that word line voltage is high. In response to the signal 454 indicating that the word line voltage is high, latch 440 may output a signal 456 (e.g. voltage) to circuitry 458 of or coupled to word line driver 450 that turns off (e.g., inhibits) the current flow through word line 410, and thus through memory cell 425.

In examples, when a negative voltage differential VDM2 is applied to memory cell 425 (e.g., the word line voltage VWL2 is high and the bit line voltage VBL2 is low) and memory cell 425 stores state 1, voltage differential VDM2 is greater (in a negative sense) than the threshold voltage Vtst01 (FIG. 2B), and memory cell 428 may snap back to a conductive state, causing the negative current flow, shown in FIG. 2B, through memory cell 425 from word line 410 to bit line 420. Sense amplifier 430 may detect this current, and/or a voltage associated therewith, for example, and may output the signal 454 to latch 440 in response to detecting this current and/or a voltage. For example, signal 454 may indicate to latch 440 that current is negative (e.g., by having a logical low value), and thus that word line voltage is low. In response to the signal 454 indicating that the word line voltage is low, latch 440 may output a signal 460 (e.g. voltage) to circuitry 462 of or coupled to word line driver 450 that turns off the current flow through word line 410. In some examples, sense amplifier 430 in combination with circuitries 458 and 462 may be referred to as detection circuitry.

Figure 5:
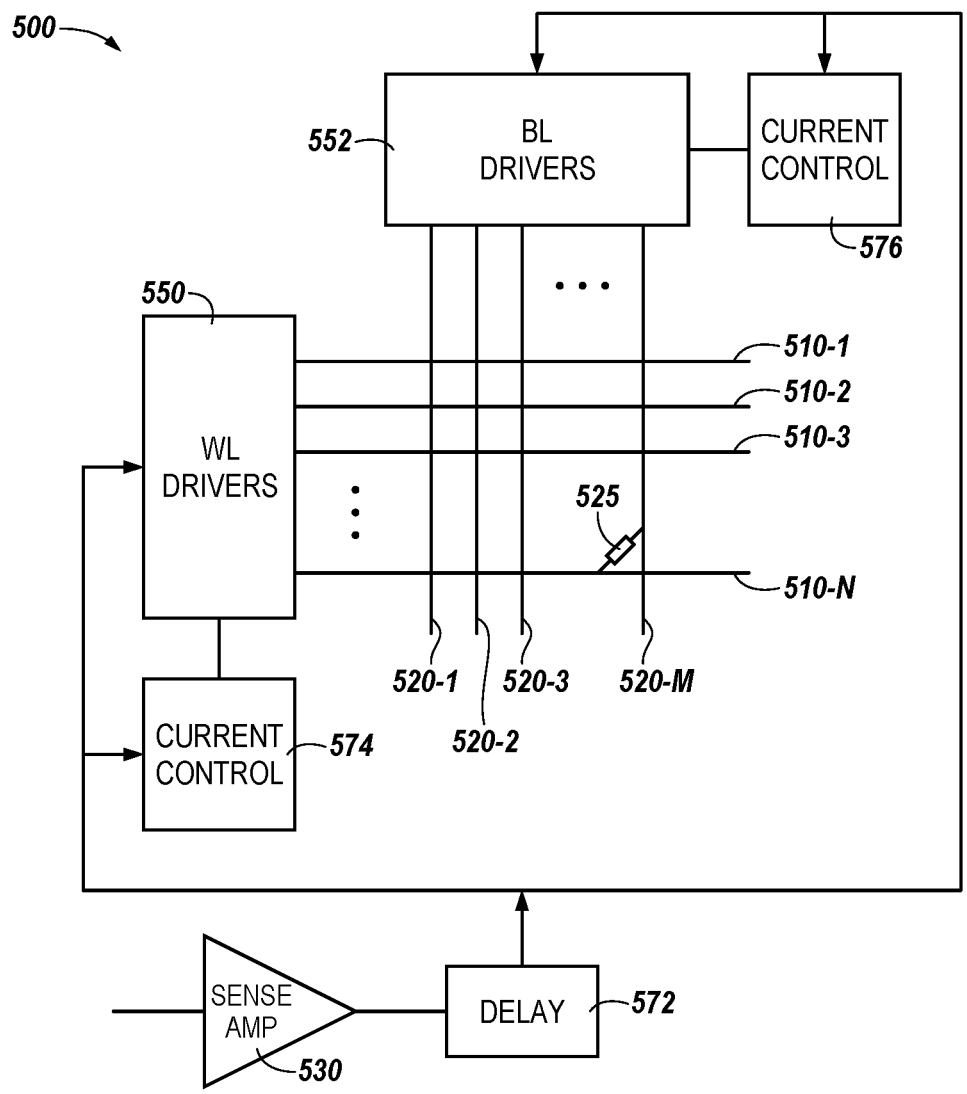
FIG. 5 illustrates an example of a portion of a memory array and associated circuitry, in accordance with an embodiment of the present disclosure.

FIG. 5 illustrates an example of a portion of a memory array 500 in accordance with an embodiment of the present disclosure. Memory array 500 may be a portion of memory arrays 100 and/or 400 previously described in connection with FIGS. 1 and 4, respectively. For example, memory array 500 may include a plurality of intersecting word lines 510-1 to 510-N and bit lines 520-1 to 520-M, with a memory cell 525 coupled to word line 510-N and bit line 520-M that may be operated as described herein.

A different respective word line driver, each analogous to driver 450 described in connection with FIG. 4 and illustrated collectively as word line drivers 550 in FIG. 5, may be coupled to each respective word line 510-1 to 510-N. Similarly, a different respective bit line driver, each analogous to driver 452 described in connection with FIG. 4 and illustrated collectively as bit line drivers 552 in FIG. 5, may be coupled to each respective bit line 520-1 to 520-M. The current supplied to word lines 510-1 to 510-N by each respective word line driver 550 can be controlled by current control circuitry 574 shown in FIG. 5, and the current supplied to bit lines 520-1 to 520-M by each respective bit line driver 552 can be controlled by current control circuitry 576 shown in FIG. 5.

As shown in FIG. 5, a sense amplifier 530 may be coupled to word line and bit line drivers 550 and 552, respectively, and/or to current control 574 and 576. Sense amplifier 530 can be, for example, sense amplifier 430 described in connection with FIG. 4, and can sense a snap back event that occurs in memory cell 525, as previously described herein. Upon sense amplifier 530 sensing a snap back event in memory cell 525, sense amplifier 530 (e.g., the output of sense amplifier 530) can provide feedback to turn off (e.g., disable) the word line driver 550 and/or bit line driver 552 coupled to word line 510-N and/or bit line 520-M, respectively, and/or to turn off the current control circuitry 574 and/or 576 coupled to the word line driver 550 and/or bit line driver 552, respectively, to turn off current to memory cell 525. After the current to memory cell 525 has been turned off, a number of short voltage pulses can be applied to memory cell 525 to program the cell to one of a plurality of possible data states, as previously described herein.

As shown in FIG. 5, delay circuitry 572 may be coupled to sense amplifier 530 (e.g., to the output of sense amplifier 530). Delay circuitry 572 can be used (e.g., programmed) to provide a short delay, such as, for instance, 4 ns, between the time when sense amplifier 530 senses the snap back event in memory cell 525 and the time when the feedback is provided to turn off the current to memory cell 525. Such a delay can change the impact that the short voltage pulses that are applied to memory cell 525 after the current has been turned off may have on the memory cell (e.g., on the threshold voltage of the cell). Alternatively, delay circuitry 572 can be bypassed, such that no such delay is provided and the feedback is provided to turn off the current to memory cell 525 as quickly as possible (e.g., immediately upon sense amplifier sensing the snap back event in the cell).

Figure 6:
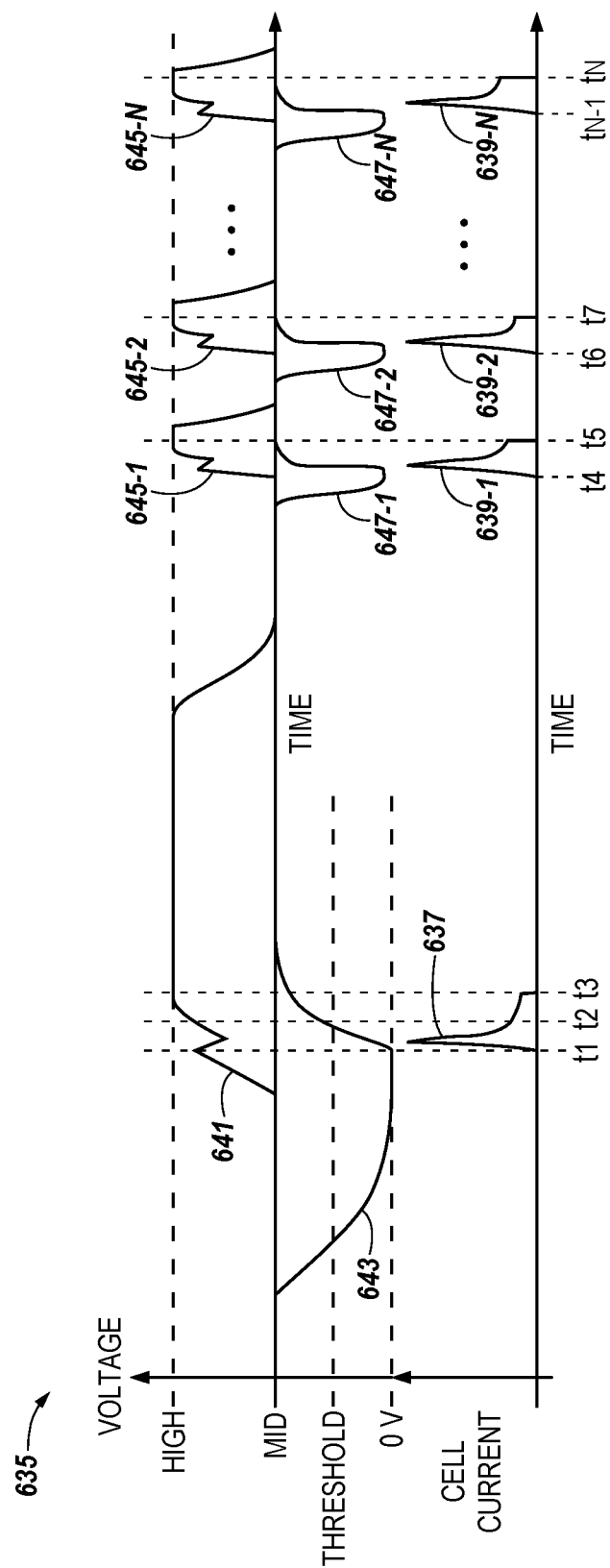
FIG. 6 illustrates an example of voltage applied to a memory cell and current flow through the memory cell, in accordance with an embodiment of the present disclosure.

FIG. 6 illustrates an example, in the form of graph 635, of voltage applied to a memory cell and current flow through the memory cell, in accordance with an embodiment of the present disclosure. For example, graph 635 can illustrate the voltage applied to a memory cell and the current flow through the memory cell during an operation to program the memory cell to one of a plurality of possible data states in accordance with the present disclosure. The memory cell can be, for example, memory cell 125, 425, and/or 525 previously described in connection with FIGS. 1, 4, and 5, respectively.

Prior to time t1 shown in FIG. 6, a bias voltage pulse with a magnitude high enough to cause the memory cell to snap back is applied to the memory cell. The bias voltage pulse can comprise a voltage pulse 641 applied to a bit line coupled to the memory cell (e.g., VBL), and a voltage pulse 643 applied to a word line coupled to the memory cell (e.g., VWL). In the example illustrated in FIG. 6, the mid-level voltage of graph 635 can be 2.75 V and the high level voltage of graph 635 can be 5.5 V.

At time t1 shown in FIG. 6, the memory cell snaps back in response to the applied bias voltage pulse. When the memory cell snaps back, a pulse 637 of current flows through the cell, which can be used to detect the snap back event, as previously described herein. For example, as the current flow dissipates after time t1, the voltage on the word line coupled to the memory cell (e.g., VWL) increases, as illustrated in FIG. 6. At time t2 shown in FIG. 6, VWL reaches a voltage threshold level. When VWL reaches the voltage threshold level, it can be determined that the memory cell has snapped back. For instance, a sense amplifier (e.g., sense amplifier 430 and/or 530 previously described in connection with FIGS. 4 and 5, respectively) can sense that VWL has reached the voltage threshold level, as previously described herein. In the example illustrated in FIG. 6, the voltage threshold level can be 0.45 V. Further, the amount of time between t1 and t2 can be 1 ns.

Upon determining that the memory cell has snapped back, the current to the memory cell can be turned off (e.g., inhibited), as previously described herein. For instance, in the example illustrated in FIG. 6, the current to the memory cell is turned off at time t3. That is, in the example illustrated in FIG. 6, there is a short delay between the time t2 when it is determined the memory cell has snapped back and the time t3 when the current to the memory cell is turned off. This delay (e.g., the amount of time between t2 and t3) can be, for instance, 4 ns. When the current to the memory cell is turned off, no current flows through the cell, as illustrated in FIG. 6.

After the current to the memory cell has been turned off, a number of (e.g. N) additional voltage pulses can be sequentially applied to the memory cell, as previously described herein. Each respective additional voltage pulse can comprise a voltage pulse applied to the bit line coupled to the memory cell (e.g., VBL) and a voltage pulse applied to the word line coupled to the memory cell (VWL). For instance, in the example illustrated in FIG. 6, a first additional voltage pulse comprising voltage pulse 645-1 applied to the bit line and voltage pulse 647-1 applied to the word line is applied to the memory cell time t4, a second additional voltage pulse comprising voltage pulse 645-2 applied to the bit line and voltage pulse 647-2 applied to the word line is applied to the memory cell at time t6, and an Nth additional voltage pulse comprising voltage pulse 645-N applied to the bit line and voltage pulse 647-N applied to the word line is applied to the memory cell at time tN−1.

Further, each respective additional voltage pulse is applied to memory cell for a short amount of time (e.g., the first additional pulse is applied from time t4 to time t5, the second additional pulse is applied from time t6 to time t7, and the Nth additional pulse is applied from time tN−1 to time N), as illustrated in FIG. 6. For instance, the duration of each respective additional voltage pulse (e.g., the amount of time between time t4 and t5, the amount of time between time t6 and t7, and the amount of time between time tN−1 and time tN) can be 5 ns.

When each respective additional voltage pulse is applied to the memory cell, an additional pulse of current flows through the memory cell. For instance, in the example illustrated in FIG. 6, pulse 639-1 of current flows through the memory cell when the first additional voltage pulse is applied to the cell, pulse 639-2 of current flows through the memory cell when the second additional voltage pulse is applied to the cell, and pulse 639-N of current flows through the memory cell when the Nth additional voltage pulse is applied to the cell. The additional pulses of current can be used to program the memory cell to one of a plurality of possible data states, as previously described herein.

Figure 7:
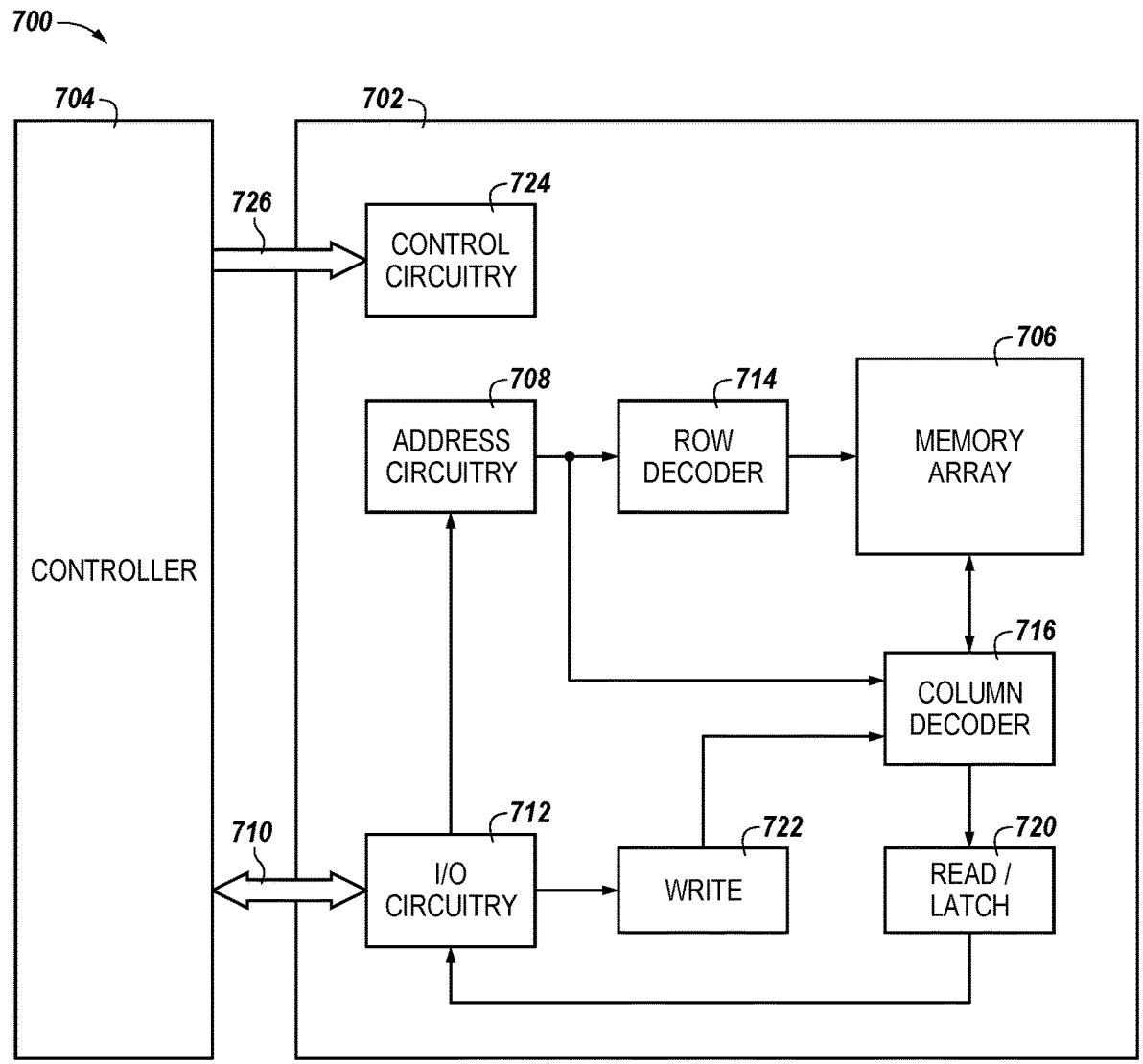
FIG. 7 is a block diagram illustration of an example apparatus, in accordance with an embodiment of the present disclosure.

FIG. 7 is a block diagram illustration of an example apparatus, such as an electronic memory system 700, in accordance with an embodiment of the present disclosure. Memory system 700 includes an apparatus, such as a memory device 702, and a controller 704, such as a memory controller (e.g., a host controller). Controller 704 might include a processor, for example. Controller 704 might be coupled to a host, for example, and may receive command signals (or commands), address signals (or addresses), and data signals (or data) from the host and may output data to the host.

Memory device 702 includes a memory array 706 of memory cells. For example, memory array 706 may include one or more of the memory arrays, such as a cross-point array, of memory cells disclosed herein.

Memory device 702 includes address circuitry 708 to latch address signals provided over I/O connections 710 through I/O circuitry 712. Address signals are received and decoded by a row decoder 714 and a column decoder 716 to access the memory array 706. For example, row decoder 714 and/or column decoder 716 may include drivers, such as drivers 450, 452, 550, and/or 552 as previously described in conjunction with FIGS. 4 and 5.

Memory device 702 may sense (e.g., read) data in memory array 706 by sensing voltage and/or current changes in the memory array columns using sense/buffer circuitry that in some examples may be read/latch circuitry 720. Read/latch circuitry 720 may read and latch data from the memory array 706. I/O circuitry 712 is included for bi-directional data communication over the I/O connections 710 with controller 704. Write circuitry 722 is included to write data to memory array 706.

Control circuitry 724 may decode signals provided by control connections 726 from controller 704. These signals may include chip signals, write enable signals, and address latch signals that are used to control the operations on memory array 706, including data read and data write operations.

Control circuitry 724 may be included in controller 704, for example. Controller 704 may include other circuitry, firmware, software, or the like, whether alone or in combination. Controller 704 may be an external controller (e.g., in a separate die from the memory array 706, whether wholly or in part) or an internal controller (e.g., included in a same die as the memory array 706). For example, an internal controller might be a state machine or a memory sequencer.

In some examples, controller 704 may be configured to cause memory device 702 to at least perform the methods disclosed herein, such as programming the memory cells of array 706 to one of a plurality of possible data states. In some examples, memory device 702 may include the circuitry previously described in conjunction with FIGS. 4 and/or 5. For example, memory device 702 may include the sense amplifier circuitry and latches, such as sense amplifiers 430 and/or 530, latch 440, and/or delay circuitry 572 disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 700 of FIG. 7 has been simplified. It should be recognized that the functionality of the various block components described with reference to FIG. 7 may not necessarily be segregated to distinct components or component portions of an integrated circuit device. For example, a single component or component portion of an integrated circuit device could be adapted to perform the functionality of more than one block component of FIG. 7. Alternatively, one or more components or component portions of an integrated circuit device could be combined to perform the functionality of a single block component of FIG. 7.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a plurality of memory cells; and
   circuitry configured to program a memory cell of the plurality of memory cells to one of at least three possible data states by:
   applying a voltage pulse to the memory cell;
   determining the memory cell snaps back in response to the applied voltage pulse;
   turning off a current to the memory cell upon determining the memory cell snaps back; and
   applying a number of additional voltage pulses to the memory cell after turning off the current to the memory cell, wherein each of the number of additional voltage pulses have a same magnitude.

2. The apparatus of claim 1, wherein one of the at least three possible data states is associated with a threshold voltage distribution whose magnitude is greater for a first polarity than a second polarity.

3. The apparatus of claim 2, wherein an additional one of the at least three possible data states is associated with an additional threshold voltage distribution whose magnitude is greater for the second polarity than the first polarity.

4. The apparatus of claim 1, wherein one of the at least three possible data states is associated with a threshold voltage distribution whose magnitude is substantially equal for a first polarity and a second polarity.

5. The apparatus of claim 1, wherein one of the at least three possible data states is associated with a symmetric threshold voltage distribution.

6. The apparatus of claim 1, wherein the at least three possible data states comprise six possible data states.

7. The apparatus of claim 1, wherein the number of additional voltage pulses comprise four additional voltage pulses.

8. The apparatus of claim 1, wherein the number of additional voltage pulses comprise six additional voltage pulses.

9. An apparatus, comprising:
   a memory having a plurality of memory cells; and
   circuitry configured to program a memory cell of the plurality of memory cells to one of at least three possible data states by:
      applying a voltage pulse to the memory cell;
      determining the memory cell snaps back in response to the applied voltage pulse;
      turning off a current to the memory cell upon determining the memory cell snaps back; and
      applying a single additional voltage pulse to the memory cell after turning off the current to the memory cell, wherein a duration of the single additional voltage pulse is shorter than a duration of the voltage pulse, and wherein the single additional voltage pulse has a same magnitude for the duration of the single additional voltage pulse.

10. The apparatus of claim 9, wherein each of the plurality of memory cells is a self-selecting memory cell.

11. The apparatus of claim 9, wherein the duration of the single additional voltage pulse is five nanoseconds.

12. The apparatus of claim 9, wherein the voltage pulse and the single additional voltage pulse have a same magnitude.

13. The apparatus of claim 9, wherein applying the single additional voltage to the memory cell increases a threshold voltage of the memory cell.

14. The apparatus of claim 9, wherein applying the single additional voltage to the memory cell decreases a threshold voltage of the memory cell.

15. A method of operating memory, comprising:
   programming a memory cell to one of at least three possible data states by:
      applying a voltage pulse to the memory cell;
      determining the memory cell snaps back in response to the applied voltage pulse;
      turning off a current to the memory cell upon determining the memory cell snaps back; and
      applying one additional voltage pulse to the memory cell after turning off the current to the memory cell, wherein the one additional voltage pulse has a same magnitude for a duration of the one additional voltage pulse; or
      applying two additional voltage pulses to the memory cell after turning off the current to the memory cell, wherein each of the two additional voltage pulses have a same magnitude.

16. The method of claim 15, wherein the one additional voltage pulse has a first polarity or a second polarity that is opposite the first polarity.

17. The method of claim 15, wherein each of the two additional voltage pulses have a same polarity.

18. The method of claim 15, wherein the at least three possible data states comprise four possible data states.

19. The method of claim 15, wherein the method includes determining the memory cell snaps back using a sense amplifier.

20. The method of claim 15, wherein the method includes determining the memory cell snaps back by determining that a voltage on a signal line coupled to the memory cell meets or exceeds a particular voltage threshold.

* * * * *